(12) United States Patent
Chen et al.

(10) Patent No.: US 6,468,824 B2
(45) Date of Patent: Oct. 22, 2002

(54) METHOD FOR FORMING A SEMICONDUCTOR DEVICE HAVING A METALLIC SUBSTRATE

(75) Inventors: Nai-Chuan Chen, Pan-Chiao; Bor-Jen Wu, Taipei; Yuan-Hsin Tzou, Kaohusiung; Nae-Guann Yih, Tao-Yuan; Chien-An Chen, Hsin-Chuang, all of (TW)

(73) Assignee: Uni Light Technology Inc., Tao-Yuan (TW)

( * ) Notice: Subject to any disclaimer, the term of this patent is extended or adjusted under 35 U.S.C. 154(b) by 0 days.

(21) Appl. No.: 09/814,412

(22) Filed: Mar. 22, 2001

(65) Prior Publication Data

US 2002/0137243 A1 Sep. 26, 2002

(51) Int. Cl.⁷ ............................................. H01L 21/00
(52) U.S. Cl. .................................................... 438/46
(58) Field of Search .......................... 438/29, 34, 46, 438/47, 455, 458, 459

(56) References Cited

U.S. PATENT DOCUMENTS

| | | | | |
|---|---|---|---|---|
| 5,008,718 A | * | 4/1991 | Fletcher et al. | 357/17 |
| 5,376,580 A | * | 12/1994 | Kish et al. | 437/127 |
| 5,391,257 A | * | 2/1995 | Sullivan et al. | 156/630 |
| 5,646,067 A | * | 7/1997 | Gaul | 437/180 |
| 5,789,320 A | * | 8/1998 | Andricacos et al. | 438/678 |
| 5,807,783 A | * | 9/1998 | Gaul et al. | 438/406 |
| 6,033,925 A | * | 3/2000 | Han et al. | 438/30 |
| 6,046,065 A | * | 4/2000 | Goldstein et al. | 438/46 |
| 6,100,166 A | * | 8/2000 | Sakaguchi et al. | 438/455 |
| 6,194,245 B1 | * | 2/2001 | Tayanaka | 438/57 |
| 6,258,699 B1 | * | 7/2001 | Chang et al. | 438/458 |
| 6,287,882 B1 | * | 9/2001 | Chang et al. | 438/29 |

FOREIGN PATENT DOCUMENTS

JP        2001250972 A   *  3/2000

* cited by examiner

*Primary Examiner*—Richard Booth
*Assistant Examiner*—Angel Roman
(74) *Attorney, Agent, or Firm*—Powell, Goldstein, Frazer & Murphy LLP

(57) ABSTRACT

The present invention provides a method for forming a semiconductor device with a metallic substrate. The method comprises providing a semiconductor substrate. At least a semiconductor layer is formed on the semiconductor substrate. A metallic electrode layer is formed on the semiconductor layer. The metallic substrate is formed on the metallic electrode layer and the semiconductor substrate is removed. The metallic substrate has advantages of high thermal and electrical conductivity, that can improve the reliability and life-time of the semiconductor device.

28 Claims, 5 Drawing Sheets

METHOD FOR FORMING A SEMICONDUCTOR DEVICE HAVING A METALLIC SUBSTRATE

BACKGROUND OF THE INVENTION

1. Field of the Invention

The invention relates to a method and structure for semiconductor devices, and more particularly to a method and structure for optical semiconductor devices.

2. Description of the Prior Art

Semiconductor devices are employed in a wide variety of electrical applications, for example, in central processors, memory devices, microwave devices, and light emitting devices.

One concern with the semiconductor devices is heat influencing on the semiconductor device. When temperature is raised by heat, reliability and life time of the semiconductor device are reduced. For optical semiconductor device, such as light emitting diode(LED), lateral laser, or planar laser, the efficiency of light emitting is also reduced by raising the temperature. An example of AlGaInP type LED, the light is emitted from electrons at an energy level of $\Gamma$ bandgap combined with electronic holes. When the temperature is raised, partical electrons will jump on an energy level of X bandgap and then combine with the electronic holes, which may generate heat that reduces efficiency of internal quantum and efficiency of light-emitting.

The layers of many conventional light-emitting diodes (LEDs) are grown on an optically absorbing substrate having an energy gap less than the emission energy of the active region of the LED. The substrate absorbs some of the light generated within the active region, thereby reducing the efficiency of the device. An example of a prior art AlGaInhP LED of the double heterojunction type is shown in FIG. 1. An epitaxial layer 112 of n-doped $(Al_xGa_{1-x})_{0.5}In_{0.5}P$, a light extraction layer 114 of $(Al_xGa_{1-x})_{0.5}In_{0.5}P$ and an epitaxial layer 116 of p-doped $(Al_xGa_{1-x})_{0.5}In_{0.5}P$ are grown on an n-type substrate 110 where "x" is a percent of chemical composition. A double heterojunction structure as a region of light emitting is formed between layers 112–116. An optically transparent window layer 118 of p-doped $Al_xGa_{1-x}$. As or GaP is grown on the epitaxial layer 116. The optically transparent window layer 118 enhances lateral conductibility of p-type region and further improves current spreading on the double heterojunction structure. On the other hand, the amount of "x" in the light extraction layer 114 determines wavelength of light emitting. The bandgaps of the epitaxial layers 112, 116, and the optically transparent window layer 118 are chosen so as to cause light to be generated in the light extraction layer 114 and to travel through the epitaxial layers 112, 116, and the optically transparent window layer 118 without being absorbed. However, absorption of light does occur at the GaAs substrate 110 which causes downwardly emitted or directed light to be absorbed and reduces light-emitting efficiency of the light emitting devices.

There are several techniques for resolving the light to be absorbed by the substrate. A first technique is to grow the light-emitting devices on a non-absorbing substrate. However, a problem with this technique is that acceptable lattice matching may be difficult to achieve, depending upon the lattice constant of the substrate similar to that of the LED epitaxial layers. A second technique is to grow a distributed Bragg reflector between the LED epitaxial layers and the substrate. An increase in efficiency is achieved, since the distributed Bragg reflector will reflect light that is emitted or internally reflected in the direction of the absorbing substrate. However, the improvement is limited because the distributed Bragg reflector only reflects light that is of near normal incidence. Light that differs from a normal incidence by a significant amount is not reflected and passes to the substrate, where it is absorbed.

A third technique is to grow the LED epitaxial layers on an absorbing substrate that is later removed. A transparent "substrate" is fabricated by growing a thick, optically transparent and electrically conductive epitaxial layers formed thereon. The absorbing substrate is then removed by methods of polishing, etching, or wafer lift off. The thin wafers are so thin and susceptible to fragile that a rather thick substrate is required. However, a "thick" transparent substrate requires a long growth time, limiting the manufacturing throughout of such LEDs. Moreover, the epitaxy growth spends much time and costs.

A concern with current distribution of LED is considered. Depicted in FIG. 2, an n-type substrate 132 is on an n-type ohmic contact 130 that contains a composition of Au/Ge. A light extraction 134 is on the n-type substrate 132, which is a structure of single or double heterojunction, or a structure of multiple-quantum well. A p-type transparent window layer 136 is grown on the light extraction 134. A bonding pad 138 of p-type ohmic contact generally contains a composition of Au/Be or Au/Zn. A light emitted from the light extraction layer 134 results from current travelling from the bonding pad 138 to the p-type transparent window layer 136. However, partial current may laterally travel between the p-type transparent window layer 136. A part of current may be ineffective because it cannot be achieved to exterior of grain when current travels upwardly and is blocked by the bonding pad 138. A technique for resolving the problem is to grow a current blocking right below the bonding pad and whereby the current cannot directly travel downwardly to the light extraction layer 134. For example, shown in FIG. 3, a current blocking 140 of n-type layer, whose conductivity is different from that of the transparent window layer 136, is utilized to achieve the effect of current blocking. There are two current methods for fabricating the current blocking 140. A two-step epitaxy method is to grow sequentially the current blocking layer and the light extraction layer 134 on the substrate 132. The current blocking layer is etched to form the current blocking 140 of n-type layer and placed again into an epitaxy chamber for sequentially growing the transparent window layer 136. However, the epitaxy chamber is susceptible to pollution that influences the properties of epitaxial layers. A second method is to utilize selectively local diffusion. However, it is difficult to control the fabrication condition.

SUMMARY OF THE INVENTION

It is an object of the present invention to provide a method for forming metallic substrate replacing conventional semiconductor substrate. The reliability and duration time of a semiconductor device may be enhanced by high thermal and electrical conductivity of the metallic substrate. Moreover, the metallic substrate also can enhance efficiency of light output for an optical semiconductor device.

It is another object of the present invention to provide a method for forming a mirrored or rough surface between the metallic substrate and the semiconductor layers for a light-emitting device. An acceptive mirrored surface may be a metallic surface or one caused by the differential of refractive index. The mirrored or rough surface can reorient downward lights from the light extraction layer and enable the downward lights to be far away from surface of grain so as to enhance the efficiency of light emitting.

It is yet an object of the present invention to provide a technique of metallic substrate. A current blocking layer below a light extraction layer is provided to block current and to enhance the efficiency of light emitting.

It is yet another object of the present invention to provide a method for forming a metallic layer as a temporary substrate whereby thin layers of semiconductor may be took out for other applications.

In the present invention, a method for forming a semiconductor device with a metallic substrate. The method comprises providing a semiconductor substrate. At least a semiconductor layer is formed on the semiconductor substrate. A metallic electrode layer is formed on the semiconductor layer. The metallic substrate is formed on the metallic electrode layer and the semiconductor substrate is removed. The metallic substrate has advantages of high thermal and electrical conductivity, that can improve the reliability and life-time of the semiconductor device.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method for forming a semiconductor device with a metallic substrate. The method comprises providing a semiconductor substrate. At least a semiconductor layer is formed on the semiconductor substrate. A metallic electrode layer is formed on the semiconductor layer. The metallic substrate is formed on the metallic electrode layer and the semiconductor substrate is removed. The metallic substrate has advantages of high thermal and electrical conductivity, that can improve the reliability and life-time of the semiconductor device.

Figure 1:
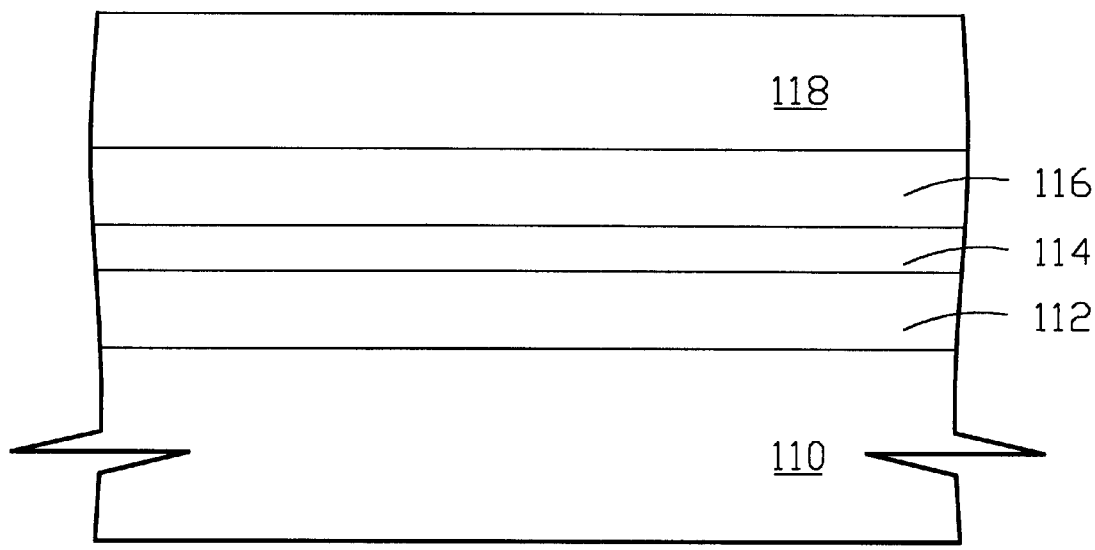
FIG. 1 is a cross-sectional view illustrating a light emitting diode in accordance with the prior art.
Figure 2:
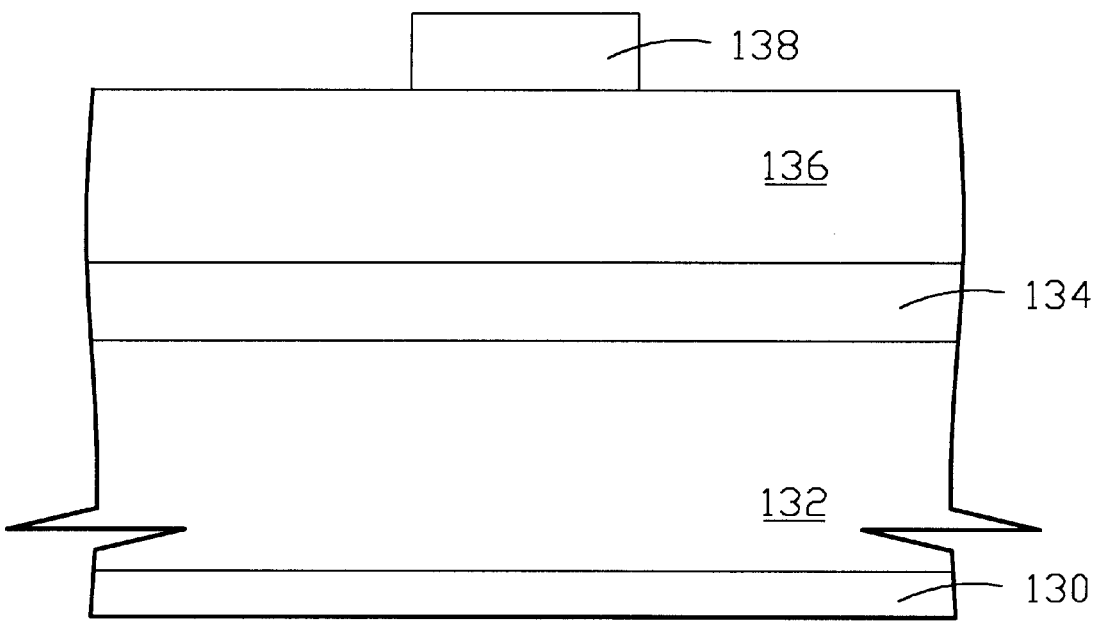
FIG. 2 is a cross-sectional view illustrating a light emitting diode including a bonding pad in accordance with the prior art.
Figure 3:
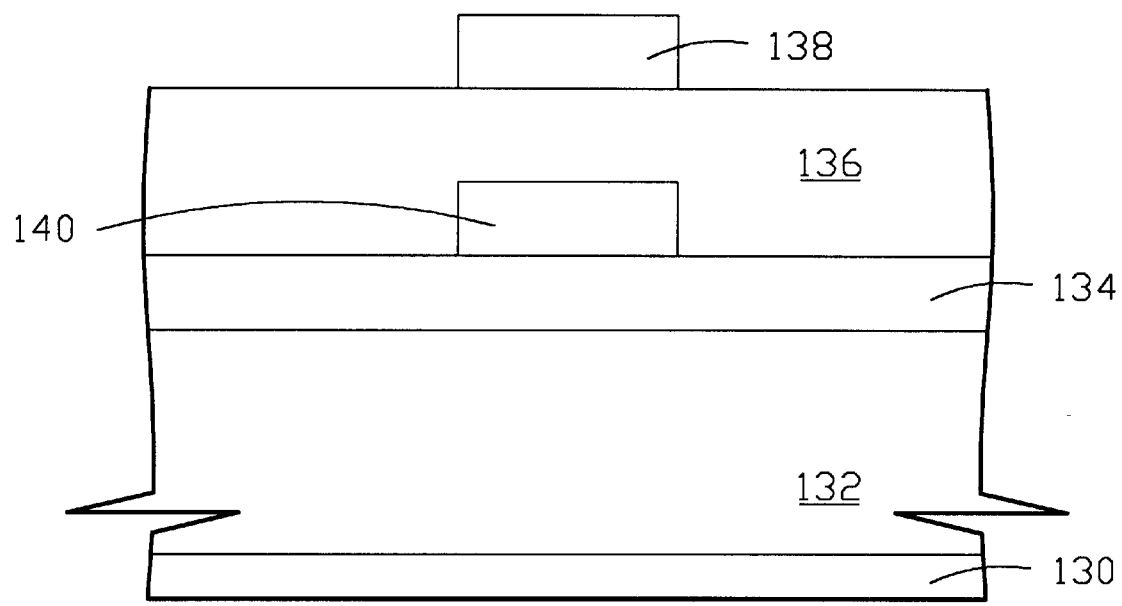
FIG. 3 is a cross-sectional view illustrating a light emitting diode including a current blocking layer in accordance with the prior art.
Figure 4:
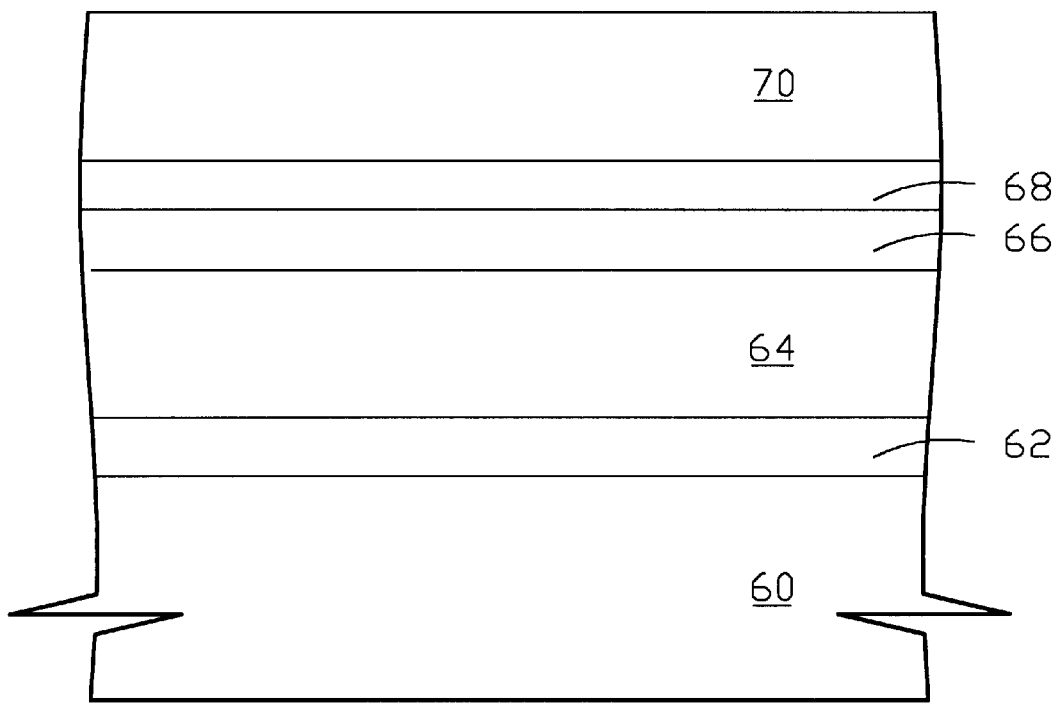
FIG. 4 is a cross-sectional view illustrating a light emitting diode having a thick metallic layer in accordance with the present invention.

With reference to FIG. 4, a first step in carrying out the invention is to select a substrate 60 onto which a plurality of LED layers will be sequentially grown. In the present invention, the substrate 60 is a temporary growth substrate which is removed subsequent to fabrication of the LED layers, so that the substrate 60 can be selected mainly for properties which provide the good growth of the LED layers. The substrate 60 can be n-type, p-type, semi-insulated, optically transparent, or optically absorptive. In a preferred embodiment, an optically absorptive substrate of n-type GaAs is considerably selected because of a little defect and a lattice constant matching with AlGaInP LED. Three LED layers 62, 64, and 66 are then grown on the substrate 60. The layers 62–66 form a double heterojunction LED, but the invention may be utilized with any type of LED devices.

The layer 62 directly above the substrate 60 is an optically transparent window layer of n-type AlGaAs. Grown above the layer 62 is an optical extraction layer 64 of AlGaInP. The layer 66 above the layer 64, such as p-type transparent GaP, p-type transparent AlGaAs, or thin GaAs, can provide good ohmic contact for subsequent process.

A metallically ohmic electrode 68 is then grown on the layer 66 after multitudes of above epitaxy growth are performed. The metallically ohmic electrode 68 may be formed by electroplating an Au/Be or Au/Zn layer in addition to high-temperature annealing. Next, a key step of the present invention is to form a "thick" metal layer 70 for a permanent substrate. In the preferred embodiment, the "thick" metal layer 70 has an exemplary thickness of 20 nanometers, which is capable of supporting those epitaxial layers because of its less fragile characteristic compared with properties of semiconductor. However, the metal layer may be also as thick as that of conventional semiconductor substrate.

There are many methods to form the metal layer as a metal substrate. For example, the "thick" metal layer 70 may be formed by evaporation or sputtering of Au, Pt, Pd, Zn, Al, Ni, Ti, alloys of the above, or any combination of alloys of the above. Further, the "thick" metal layer 70 may be also formed by melting cold-forming metals that subsequently are cast on the metallically ohmic electrode 68. The cold-forming metals may be In, Pb, Sn, or alloys of the above, etc. On the other hand, the cold-forming metals can be used as adhesives whereby other metallic materials adhere to the metallically ohmic electrode 68 to form the "thick" metal layer 70.

Furthermore, the "thick" metal layer 70 may be electroplated on metallically ohmic electrode 68 that is used as a cathode during electroplating process. The material for the "thick" metal layer 70 may be Cu, Ni, Cr, Sn, or Au, etc. For example, the "thick" metal layer 70 made of copper plating may be performed in an aqueous solution of copper sulfate and sulfuric acid. Another exemplary metal layer 70 is made of nickel plating formed in an aqueous solution of nickel sulfate, nickel chloride, and boric acid or hydrochloride acid, nickel chloride, and boric acid. Following formation of the "thick" metal layer 70, the GaAs substrate 60 is removed by using selectively etching, lapping/polishing, or wafer lifting-off.

Figure 5:
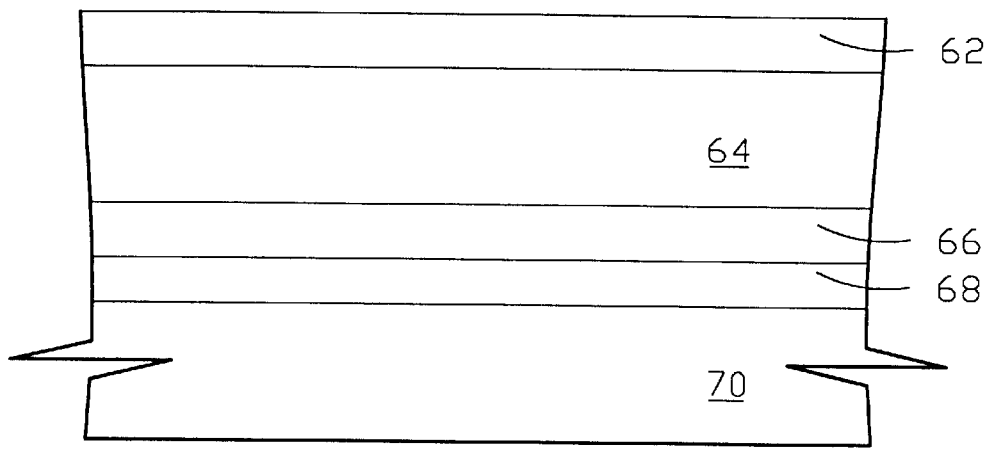
FIG. 5 is a cross-sectional view illustrating a light emitting diode substituting a metallic substrate for a temporary substrate in accordance with the present invention.

Referred to FIG. 5, the wafer is reversed upward and downward wherein the epitaxial structure of the wafer is similar to one of conventional light emitting diode except the "thick" metal layer 70 as the substrate in the embodiment. Next, multitudes of obverse bonding pads of the metallically ohmic contact are implemented by device manufacture.

Figure 6:
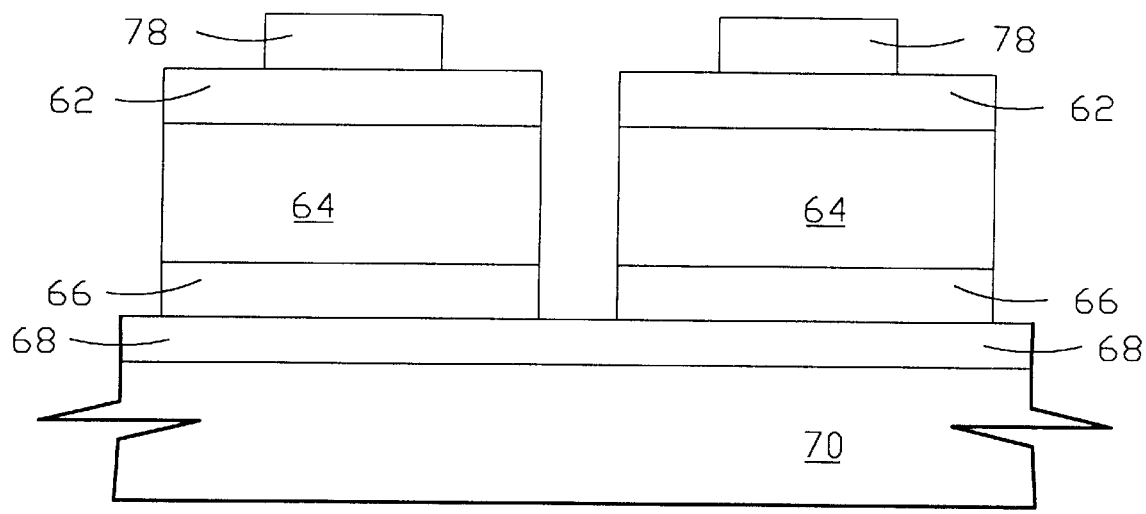
FIG. 6 is a cross-sectional view illustrating a light emitting diode including multitude of bonding pads in accordance with the present invention.

During device manufacture, high-temperature annealing is not implemented until performance of mesa etching under consideration to semiconductor layers susceptible to fragility. The purpose of high-temperature annealing is to provide a good ohmic contact between obverse bonding pad 78 of a metallic ohmic contact and a transparent window layer 62, shown in FIG. 6. The high-temperature annealing also provides tight combination between the "thick" metal layer 70 (metallic substrate) and epitaxial semiconductors. The epitaxial semiconductor consists of the optically transparent layer 66 of p-type GaP, AlGaAs, or thin GaAs, the optical extraction layer 64 of double heterojunction AlGaInP, and the transparent window layer 62.

Figure 7:
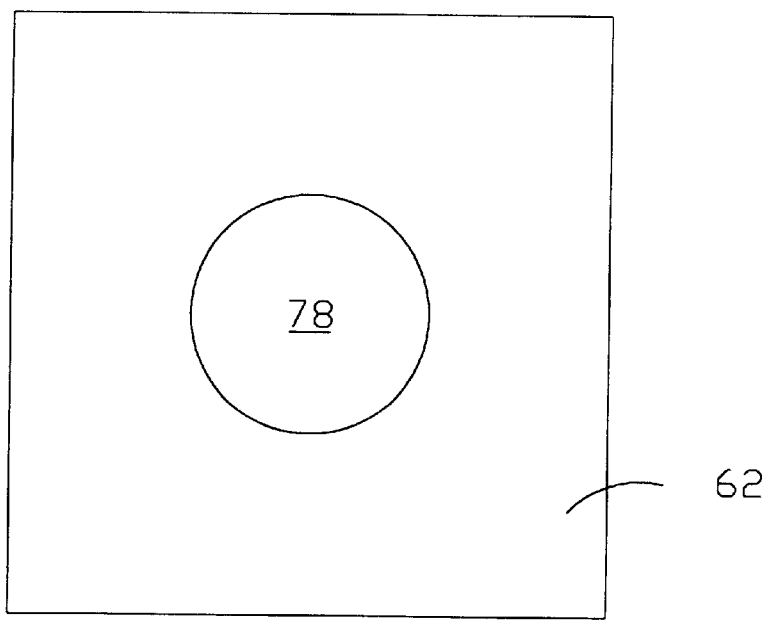
FIG. 7 is a partial top view illustrating a light emitting diode in accordance with the present invention.

Thereafter, a light emitting diode having a metallic substrate is formed by cutting the wafer into multitudes of individual crystalline grain. A top view of each crystalline grain is shown in FIG. 7. The crystalline grain has an enhanced reliability because the metallic substrate has higher thermal conductivity. Furthermore, the metallic substrate may reduce poor characteristic, such as luminance of the crystalline grain that results from raising temperature.

On the other hand, light emitting from double heterojunction layer (optical extraction layer 64 in FIG. 6) can be reflected by an interface between the p-type metallically ohmic electrode 68 and optically transparent layer 66. Unfortunately, reflective efficiency of the interface may be down by the high-temperature annealing. In the embodiment, the reflectivity of the interface can be improved by colder-forming the metallically ohmic electrode (contact) or intervening a Bragg reflector between the metallic ohmic electrode 68 and the optical extraction layer 64.

Furthermore, light-emitting refractive index may be increased by changing reflective direction. One method, for example, the rough interface between the p-type metallically ohmic electrode 68 and optically transparent layer 66 in FIG. 6 may be performed by polishing or other methods. Another method increasing light-emitting efficiency is to generate total reflection between the p-type metallically ohmic electrode 68 and the optically transparent layer 66 in FIG. 6. Non-absorbing materials having lower reflectivity than the optically transparent layer 66 may be formed between the interface whereby total reflection happens. Acceptably non-absorbing materials include $In_2O_3$, $SnO_2$, ITO, $HfO_2$, MgO, $SiO(SiO_2 SiO_x)$, $TiO(TiO_2, TiO_x, Ti_2O_3, Ti_2O_5)$, ZnO, ZnS, and $Al_2O_3$.

Figure 8:
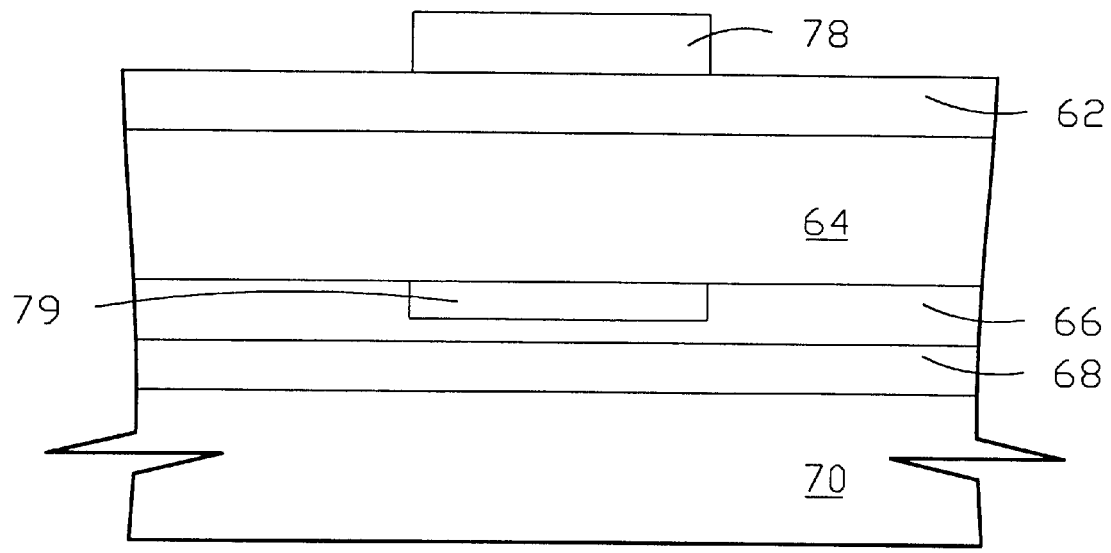
FIG. 8 is a cross-sectional view illustrating a light emitting diode including a current block layer in accordance with the present invention.

The light-emitting efficiency of light emitting diode may be increased by utilizing current blocking. It is also easy for the metallic substrate to form current blocking in the present invention. Shown in FIG. 8, a current-blocking layer 79 can be formed in the optically transparent layer 66, which is definitely located below the bonding pad 78 and used as current blocking. The effect of current blocking may be achieved by the current-blocking layer 79 that is insulating or semi-insulating. The effect of current blocking also can be achieved by the current-blocking layer 79 whose conductivity is opposite to that of the optically transparent layer. For example, the current-blocking layer 79 is p-type while the optically transparent layer is n-type.

Figure 9:
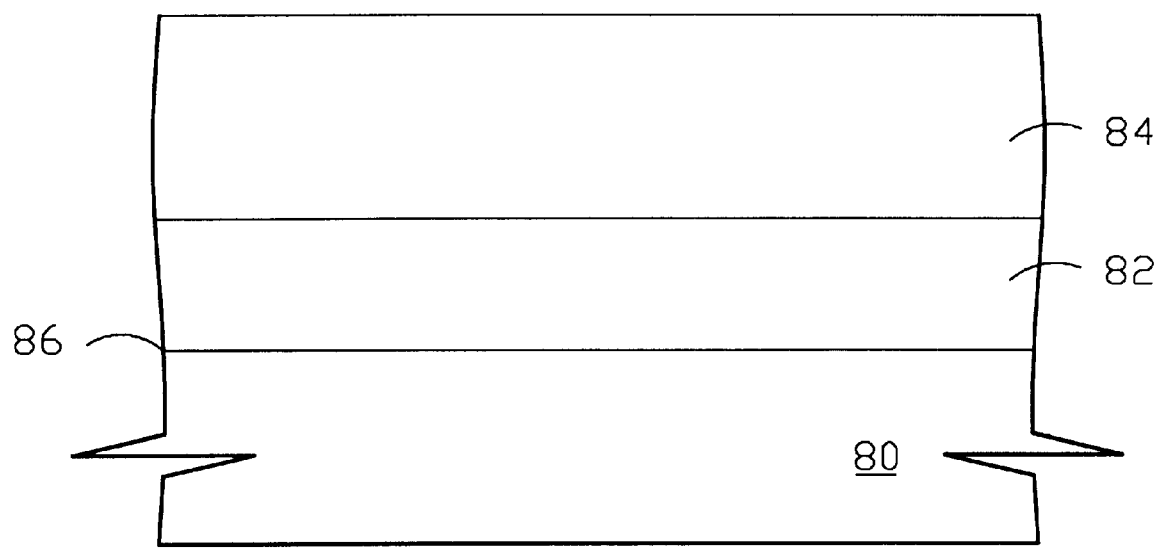
FIG. 9 is a cross-sectional view illustrating a light emitting diode having a metallic substrate as a temporary substrate in accordance with the present invention.

Moreover, one concern with the epitaxial layers in upward-and-downward reverse sequence, technology of wafer bonding or double metallic substrate can resolve the reverse sequence of the above. The technology of wafer bonding or double metallic substrate utilizes the first metallic substrate as a temporary substrate. Referred to FIG. 9, a portion 82 has the obverse surface 86 of an original wafer performed by the metallic substrate technology. The obverse surface 86 is located between a temporarily metallic substrate 80 and the portion 82. A permanent substrate 84 may be grown on the top of the portion 82 by using the technology of wafer bonding or double metallic substrate. Thereafter, the temporarily metallic substrate 80 can be removed by etching or electrolysis method. Thus, the issue of epitaxial layers in reverse sequence does not exist.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device with a metallic substrate, said method comprising:
   providing a semiconductor substrate;
   forming at least a semiconductor layer on said semiconductor substrate;
   forming a metallic electrode layer on said semiconductor layer;
   forming said metallic substrate on a surface of said metallic electrode layer; and
   removing said semiconductor substrate.

2. The method according to claim 1, wherein said metallic electrode layer is formed by electroplating an Au/Be layer and thereafter annealing.

3. The method according to claim 1, wherein said metallic electrode layer is formed by electroplating an Au/Zn layer and thereafter annealing.

4. The method according to claim 1, wherein said metallic substrate is formed by evaporation of metals selected from the groups of Au, Pt, Pd, Zn, Al, Ni, Ti, alloys of the above, or any combination of alloys of the above.

5. The method according to claim 1, wherein said metallic substrate is formed by sputtering of metals selected from the groups of Au, Pt, Pd, Zn, Al, Ni, Ti, alloys of the above, or any combination of alloys of the above.

6. The method according to claim 1, wherein said metallic substrate is formed by melting cold-forming metals that subsequently are cast on said metallically electrode layer, and said cold-forming metals are selected from the groups of In, Pb, Sn, or alloys of the above.

7. The method according to claim 1, wherein said metallic substrate is formed by electroplating that uses said metallic electrode layer as a cathode.

8. The method according to claim 7, wherein said metallic substrate is made of electroplated copper.

9. The method according to claim 7, wherein said metallic substrate is made of electroplated nickel.

10. The method according to claim 1, wherein said semiconductor device comprises an optical semiconductor device.

11. A method for forming an optical semiconductor device, said method comprising:

provideing a semiconductor substrate;

forming at least a semiconductor layer on said semiconductor substrate;

forming a metallic electrode layer on said semiconductor layer;

forming a first metallic substrate on a surface of said metallic electrode layer;

removing said semiconductor substrate; and forming a second metallic substrate on said semiconductor layer.

12. The method according to claim 11, wherein said metallic electrode layer is formed by electroplating an Au/Be layer and thereafter annealing.

13. The method according to claim 11, wherein said first metallic electrode layer is formed by electroplating an Au/Zn layer and thereafter annealing.

14. The method according to claim 11, wherein said metallic substrate is formed by evaporation of metals selected from the groups of Au, Pt, Pd, Zn, Al, Ni, Ti, alloys of the above, or any combination of alloys of the above.

15. The method according to claim 11, wherein said first metallic substrate is formed by sputtering of metals selected from the groups of Au, Pt, Pd, Zn, Al, Ni, Ti, alloys of the above, or any combination of alloys of the above.

16. The method according to claim 11, wherein said first metallic substrate is formed by melting cold-forming metals that subsequently are cast on said metallically electrode layer, and said cold-forming metals are selected from the groups of In, Pb, Sn, or alloys of the above.

17. The method according to claim 11, wherein said first metallic substrate is formed by electroplating that uses said metallic electrode layer as a cathode.

18. The method according to claim 17, wherein said first metallic substrate is made of electroplated copper.

19. The method according to claim 17, wherein said first metallic substrate is made of electroplated nickel.

20. The method according to claim 11 further comprising forming a distributed Bragg reflector between said semiconductor layer and said metallic electrode layer thereby enhances refractive index.

21. The method according to claim 11 further comprising forming a non-absorbing layer between said semiconductor layer and said metallic electrode layer, which has a reflectivity less than that of semiconductor layer.

22. A method for forming a light emitting diode (LED) having a metallic substrate, said method comprising:

providing a semiconductor substrate;

epitaxially growing a lamination of LED layers on said semiconductor substrate;

forming a metallic electrode layer on said lamination of LED layers;

forming a metallic substrate on a surface of said metallic electrode layer; and removing said semiconductor substrate.

23. The method according to claim 22, wherein said metallic electrode layer is formed by electroplating an Au/Be layer and thereafter annealing.

24. The method according to claim 22, wherein said metallic electrode layer is formed by electroplating an Au/Zn layer and thereafter annealing.

25. The method according to claim 22, wherein said metallic substrate is formed by evaporation of metals selected from the groups of Au, Pt, Pd, Zn, Al, Ni, Ti, alloys of the above, or any combination of alloys of the above.

26. The method according to claim 22, wherein said metallic substrate is formed by sputtering of metals selected from the groups of Au, Pt, Pd, Zn, Al, Ni, Ti, alloys of the above, or any combination of alloys of the above.

27. The method according to claim 22, wherein said metallic substrate is formed by melting cold-forming metals that subsequently are cast on said metallically electrode layer, and said cold-forming metals are selected from the groups of In, Pb, Sn, or alloys of the above.

28. The method according to claim 22, wherein said metallic substrate is formed by electroplating that uses said metallic electrode layer as a cathode.

* * * * *